US008872683B2

United States Patent
Ismail et al.

(10) Patent No.: US 8,872,683 B2
(45) Date of Patent: Oct. 28, 2014

(54) ELECTRONIC COMPENSATION OF CAPACITIVE MICRO-MACHINED SENSORS PARASITIC MODES IN FORCE-FEEDBACK INTERFACE SYSTEMS

(71) Applicant: Si-Ware Systems, La Canada Flintridge, CA (US)

(72) Inventors: Ayman Ismail, Cairo (EG); Ahmed Elshennawy, Cairo (EG); Ahmed Mokhtar, Cairo (EG); Ayman Elsayed, Cairo (EG)

(73) Assignee: Si-Ware Systems, Cairo (EG)

( * ) Notice: Subject to any disclaimer, the term of this patent is extended or adjusted under 35 U.S.C. 154(b) by 0 days.

(21) Appl. No.: 14/191,214

(22) Filed: Feb. 26, 2014

(65) Prior Publication Data

US 2014/0240156 A1 Aug. 28, 2014

Related U.S. Application Data

(60) Provisional application No. 61/770,402, filed on Feb. 28, 2013.

(51) Int. Cl.
| | |
|---|---|
| *H03M 3/00* | (2006.01) |
| *H03M 1/12* | (2006.01) |
| *G06F 1/10* | (2006.01) |
| *H03H 19/00* | (2006.01) |
| *H03K 5/13* | (2014.01) |
| *H03M 1/00* | (2006.01) |
| *H03H 11/12* | (2006.01) |
| *H03H 11/04* | (2006.01) |
| *H03M 1/80* | (2006.01) |
| *G01R 33/038* | (2006.01) |

(52) U.S. Cl.
CPC .............. *H03M 3/368* (2013.01); *H03M 1/12* (2013.01); *G06F 1/10* (2013.01); *H03H 19/004* (2013.01); *H03K 5/133* (2013.01); *H03M 1/00* (2013.01); *H03H 11/1291* (2013.01); *H03H 11/0422* (2013.01); *H03M 1/804* (2013.01); *H03M 3/30* (2013.01); *G01R 33/038* (2013.01)
USPC .......................................... 341/143; 327/299

(58) Field of Classification Search
CPC ........... H03M 3/30; H03M 1/00; H03M 1/12; H03M 1/804; G06F 1/10; H03K 5/133; H03H 11/0422; H03H 11/1291; H03H 19/004; G01R 33/038
USPC .......... 341/143, 110, 155, 156, 172; 327/299, 327/261, 552, 553, 554; 324/259, 679
See application file for complete search history.

(56) References Cited

U.S. PATENT DOCUMENTS 7,817,075 B2 * 10/2010 Lu ................................. 341/143

* cited by examiner

*Primary Examiner* — Joseph Lauture
(74) *Attorney, Agent, or Firm* — Useful Arts IP

(57) ABSTRACT

Operating capacitive sensors in force feedback mode has many benefits, such as improved bandwidth, and lower sensitivity to process and temperature variation. To overcome, the non-linearity of the voltage-to-force relation in capacitive feedback, a two-level feedback signal is often used. Therefore, a single-bit Σ-Δ modulator represents a practical way to implement capacitive sensors interface circuits. However, high-Q parasitic modes that exist in high-Q sensors (operating in vacuum) cause a stability problem for the Σ-Δ loop, and hence, limit the applicability of Σ-Δ technique to such sensors. A solution is provided that allows stabilizing the Σ-Δ loop, in the presence of high-Q parasitic modes. The solution is applicable to low or high order Σ-Δ based interfaces for capacitive sensors.

18 Claims, 15 Drawing Sheets

ELECTRONIC COMPENSATION OF CAPACITIVE MICRO-MACHINED SENSORS PARASITIC MODES IN FORCE-FEEDBACK INTERFACE SYSTEMS

BACKGROUND

Micro-machined inertial sensors have become an integral part of many consumer products, such as hand-held mobile terminals, cameras, and game controllers. In addition, micro-machined inertial sensors are widely used in vibration monitoring in industry, automotive safety and stability control, and navigation. In general, the read-out mechanism of micro-sensors can be piezoelectric, piezoresistive or capacitive. However, the high thermal stability, and sensitivity of capacitive sensing makes it more attractive for wide range of applications. A typical capacitive sensor interface circuit is composed of a capacitance-to-voltage converter (C/V) followed by an analog-to-digital converter (A/D) and signal conditioning circuitry. Incorporating the sensor and C/V in a $\Sigma$-$\Delta$ based force feedback loop provides many benefits, such as reducing sensitivity to sensor process and temperature variation, improving system bandwidth, and increasing dynamic range. In addition, the $\Sigma$-$\Delta$ based loop provides implicit analog-to-digital conversion, eliminating the need for a stand-alone A/D.

Capacitive inertial MEMS sensors exhibit a second order low-pass transfer function. In some systems, the MEMS serves as the $\Sigma$-$\Delta$ loop filter, resulting in a second order electro-mechanical $\Sigma$-$\Delta$ loop. However, relying only on the MEMS as the filtering element results in a resolution penalty, due to increased quantization noise. The increased quantization noise results from the reduced effective $\Sigma$-$\Delta$ loop quantizer gain, caused by electronic noise. To avoid this resolution penalty an electronic filter may be introduced to the loop. The additional electronic filter can be of first or second order for accelerometer sensors (accelerometer sensors are devices used to measure linear acceleration). For certain gyroscope systems (gyroscope devices are used to measure the angular speed in degrees/sec), a second order filter is used to implement a resonator that can produce a notch in the noise transfer function away from DC, resulting in a fourth order modulator.

Ideally, capacitive inertial MEMS sensors would behave as a second-order lumped mass-damper-spring system, with a single resonant frequency. However, in reality the sensor is a distributed element that has additional parasitic resonant modes. These parasitic modes can lead to instability of the $\Sigma$-$\Delta$ modulator.

The following references (referred to hereinafter as Seeger, Petkov, and Ezekwe, respectively) address the problem of electro-mechanical $\Sigma$-$\Delta$ loop stability in the presence of parasitic modes:

J. I. Seeger. X. Jiang. M. Kraft, and B. E. Boser. "Sense Finger Dynamics in a Sigma Delta Force Feedback Gyroscope." in *Proc. Solid-State Sensor and Actuator Workshop Dig. Tech. Papers*, June 2000, pp. 296-299.

V. P. Petkov, *High-order $\Sigma$-$\Delta$ Interface for Micromachined Inertial Sensors*. Dept. of Electrical Eng. and Comp. Science, UC Berkeley: Ph.D. Thesis, 2004.

C. D. Ezekwe, *Readout Techniques for High-Q Micromachined Vibratory Rate Gyroscopes*. Dept. of Electrical Eng. and Comp. Science, UC Berkeley: Ph.D. Thesis, 2007.

Stabilizing the loop in the presence of high-Q parasitic modes is a challenging problem. By some accounts, high-Q parasitic modes must be addressed with proper mechanical design, as using only electronic techniques was not successful [Petkov].

In Seeger, the stability of a second order electro-mechanical $\Sigma$-$\Delta$ loop is considered and it is suggested to maintain a certain relation between system sampling frequency and the parasitic mode frequency. However, Seeger is specific to a second order loop (a loop that does not incorporate electronic filter) with a low quality factor (Q) parasitic mode, and is not applicable to higher order loops or in the case of high-Q parasitic modes. In Petkov, on the other hand, the system was tested at atmospheric pressure, thereby ensuring that high frequency modes were sufficiently damped. In practice therefore, Petkov is applicable only to low-Q parasitic modes.

Ezekwe addresses high-Q parasitic modes. However, the proposed solution uses positive feedback techniques, resulting in nested feedback loops that are hard to design, optimize, and tune. More particularly, in Ezekwe, a positive feedback $\Sigma$-$\Delta$ loop is adopted. To avoid instability due to positive feedback, the DC gain is set below 1, by injecting a pseudo-random signal to the loop. Having the DC gain below 1 at DC makes the resulting system inadequate for accelerometers, and limits its use to gyroscopes, because, this condition reduces in-band noise attenuation. The loss of DC gain also results in accumulation of offset before the quantizer, which requires an additional regulation loop. The resulting system consists of nested loops that are hard to design, optimize, and tune.

An electronic fourth order $\Sigma$-$\Delta$ modulator (modulator has four integrators) with feed-forward summation is shown in FIG. 1. This electronic modulator may form the basis of electro-mechanical $\Sigma$-$\Delta$ capacitive interface circuits as described herein.

BRIEF DESCRIPTION OF THE DRAWING FIGURES

The invention may be further understood from the following detailed description in conjunction with the appended drawing figures. In the drawing.

DETAILED DESCRIPTION

Summary

The problem of stabilizing Σ-Δ electro-mechanical loops in the presence of high-Q parasitic modes is addressed. In one embodiment, introducing a second order finite impulse response (FIR) filter into the Σ-Δ electro-mechanical loop stabilizes the loop. This solution is supported by both theoretical and empirical results and is much simpler than other proposed techniques.

In another embodiment, a method is provided of electronically interfacing with a MEMS sensor using an interface circuit, the MEMS sensor and the interface circuit together forming a sigma-delta modulator loop. In accordance with the method, a potential parasitic resonant mode of the MEMS sensor is identified, the potential parasitic resonant mode having a frequency and a quality factor. A filter is inserted into the sigma-delta modulator loop having characteristics chosen in accordance with at least one of the frequency and the quality factor of the potential parasitic resonant mode.

In another embodiment, an interface circuit is provided for electronically interfacing with a MEMS sensor using an interface circuit, the MEMS sensor and the interface circuit together forming a sigma-delta modulator loop having a potential parasitic resonant mode characterized by a frequency and a quality factor. The interface circuit includes a capacitance to voltage converter; a forward loop circuit coupled to the capacitance to voltage converter and comprising a quantizer; a feedback loop coupled to the quantizer and providing a force feedback signal to the MEMS sensor; and an FIR filter inserted into the forward loop circuit and having characteristics chosen in accordance with at least one of the frequency and the quality factor of the parasitic resonant mode.

In a further embodiment, a sensor subsystem includes a MEMS sensor; and an interface circuit coupled to the MEMS sensor, the MEMS sensor and the interface circuit together forming a sigma-delta modulator loop having a potential parasitic resonant mode characterized by a frequency and a quality factor. The interface circuit in turn includes a capacitance to voltage converter; a forward loop circuit coupled to the capacitance to voltage converter and comprising a quantizer; a feedback loop coupled to the quantizer and providing a force feedback signal to the MEMS sensor; and an FIR filter inserted into the forward loop circuit and having characteristics chosen in accordance with at least one of the frequency and the quality factor of the parasitic resonant mode.

Description

Figure 2:
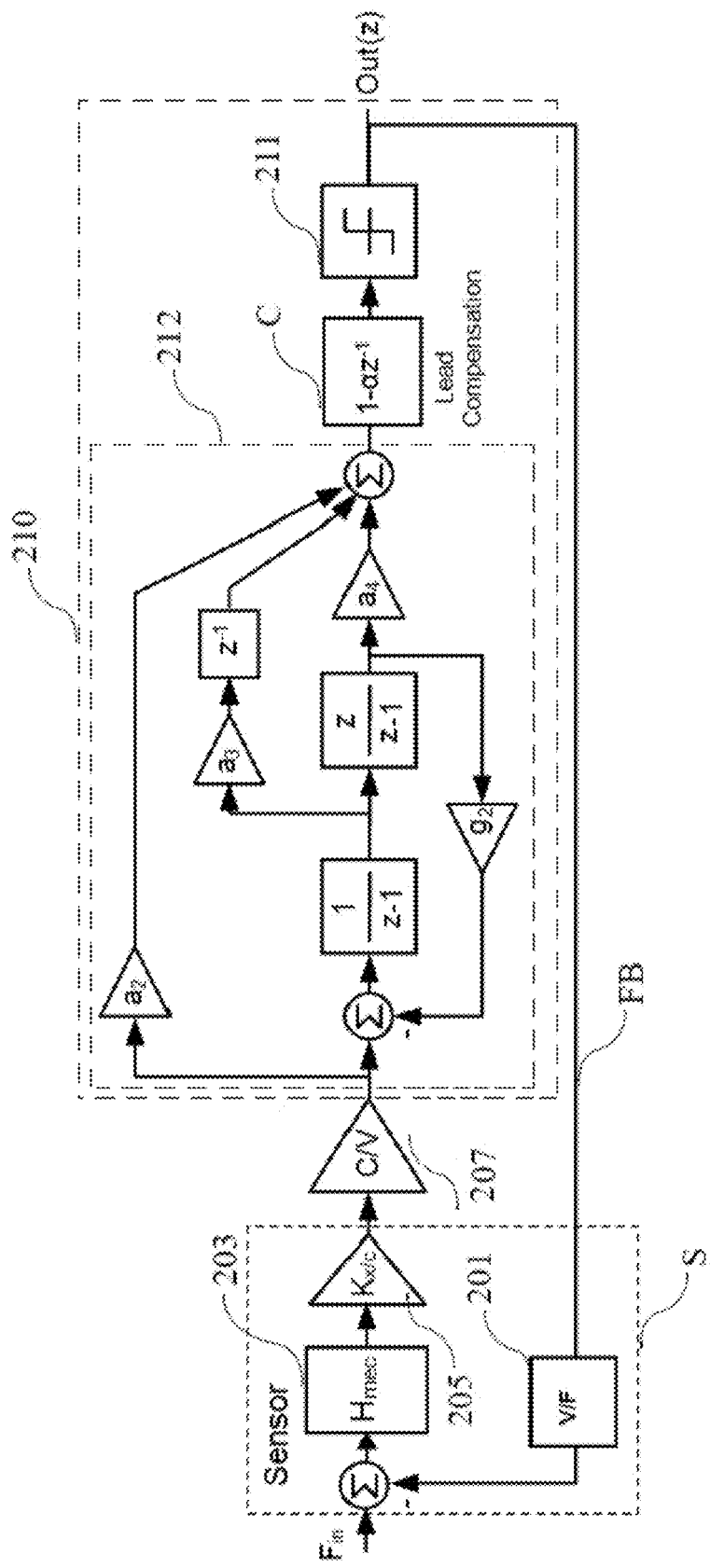
FIG. 2 is a block diagram of an electro-mechanical modulator.

An electro-mechanical modulator is shown in FIG. 2. A MEMS sensor S may be modeled by three blocks. A V/F (voltage-to-force) block 201 produces a signal representing an electrostatic force resulting from a feedback voltage FB. An $H_{mec}$ block 203 models a transfer function of the MEMS sensor, defined as the ratio of output displacement to the input force. A block $K_{x/c}$ 205 represents a displacement-to-capacitance gain. A capacitance to voltage converter C/V 207 senses the capacitance variation due to input signal $F_{in}$ and transforms it to a voltage signal that can processed by the subsequent electronic filter circuitry. The C/V converter is coupled to a feed-forward circuit 210 that includes a quantizer (comparator) 211 that produces a Σ-Δ output voltage signal Out(z), an electronic filter 212 and a compensator C. (A feed-forward summation architecture of the feed-forward circuit 210 is preferred over a distributed feedback architecture when building electromechanical loops). The Σ-Δ output comparator voltage forms a feedback signal FB that is applied to the V/F block 201 of the sensor S, creating an electrostatic feedback force.

Figure 1:
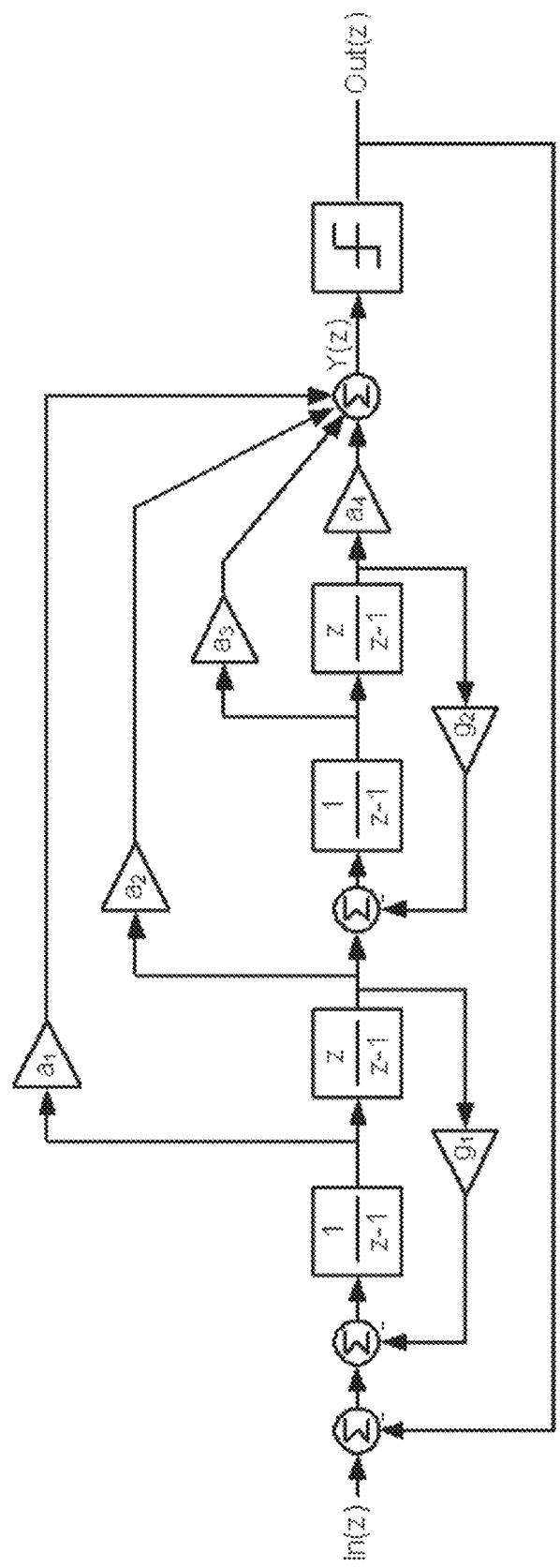
FIG. 1 is a block diagram of an electronic modulator.
Figure 3:
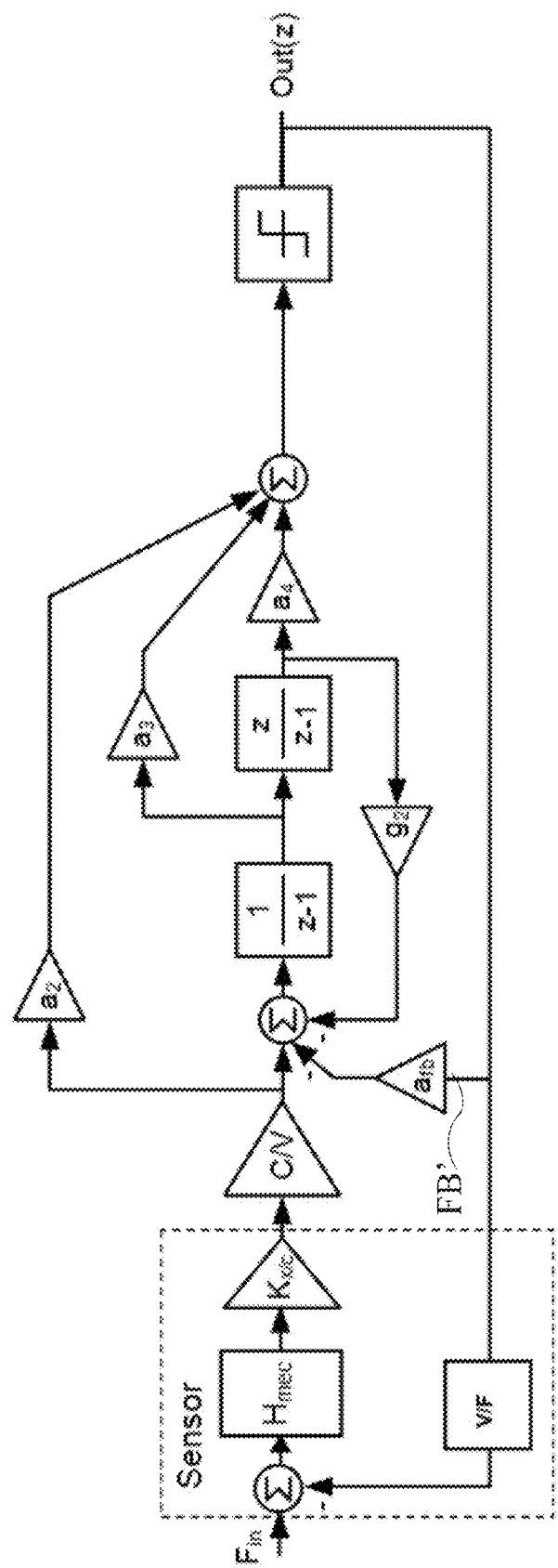
FIG. 3 is a block diagram of another electro-mechanical modulator.

Ideally, the mechanical sensor exhibits the following second-order transfer function:

$$H_{mech} = \frac{x(s)}{F(s)} = \frac{\frac{1}{m}}{s^2 + \frac{D}{m}s + \frac{K}{m}} = \frac{1}{s^2 + \frac{Q}{\omega_0}s + \omega_0^2}. \tag{1}$$

where F(s) is the input force (coriolis force in the case of gyroscopes or force, due to input acceleration, in the case of accelerometers), x(s) is the displacement in the sensor proof mass, corresponding to the input force. m is the mass of the proof mass, D is the damping coefficient, and K is the spring constant. Therefore, in an electro-mechanical Σ-Δ modulator, the mechanical sensor forms the first two integrators and the output of the first integrator is not accessible reducing the number of realizable feed-forward branches. That is, the feed-forward branch $a_1$ in FIG. 1 is eliminated. One way to overcome the lack of accessibility of the first integrator, and hence, keep the electro-mechanical loop stable, is to use a first order compensator C as shown in FIG. 2. Another way to achieve stability is to use an additional feed-back branch FB', as illustrated in FIG. 3. The later technique produces less out-of-band noise, resulting in larger quantizer effective gain, and therefore better noise shaping and higher stability.

Figure 4:
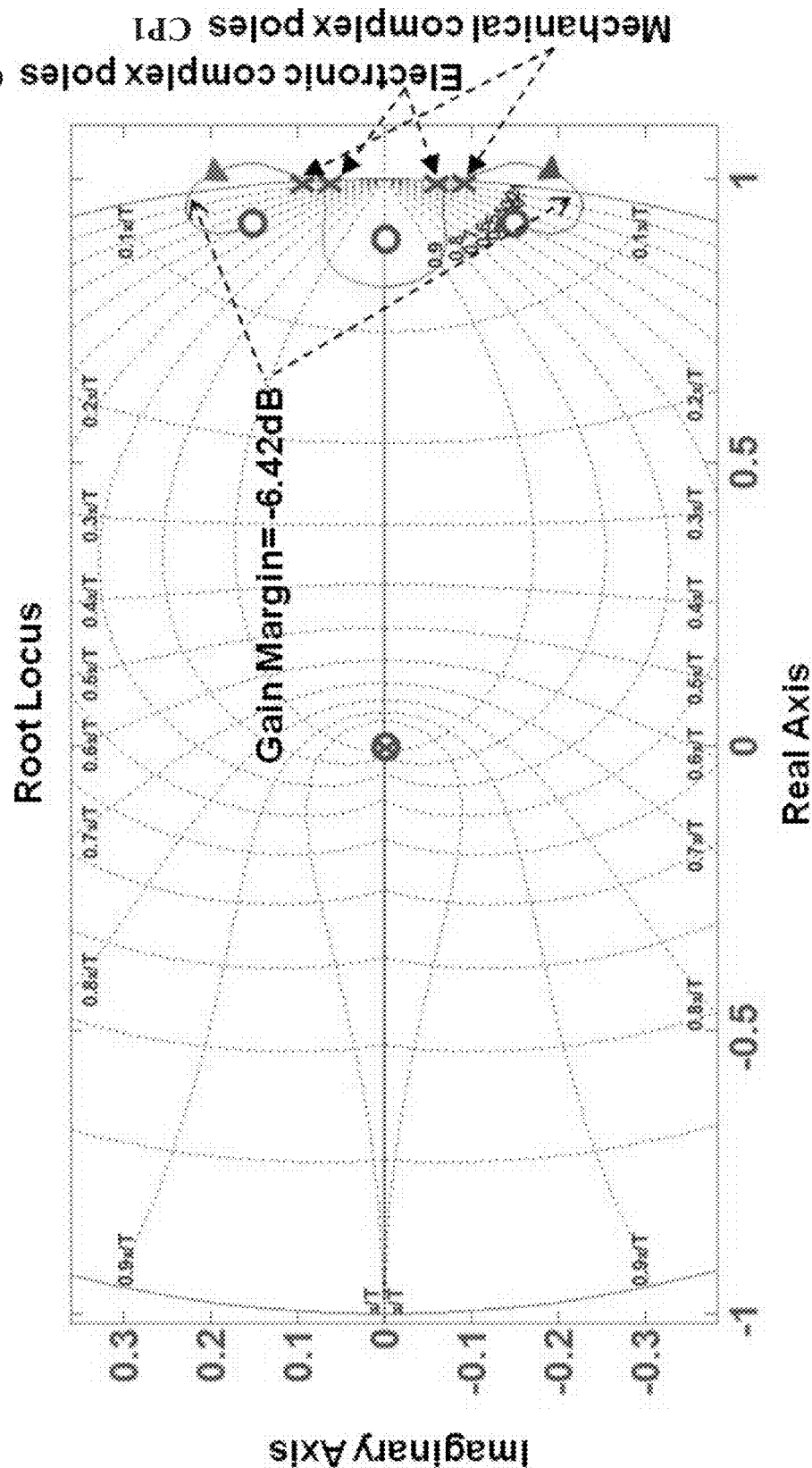
FIG. 4 is root-locus plot of a gyroscope $\Sigma$-$\Delta$ interface circuit like that of FIG. 3.
Figure 5:
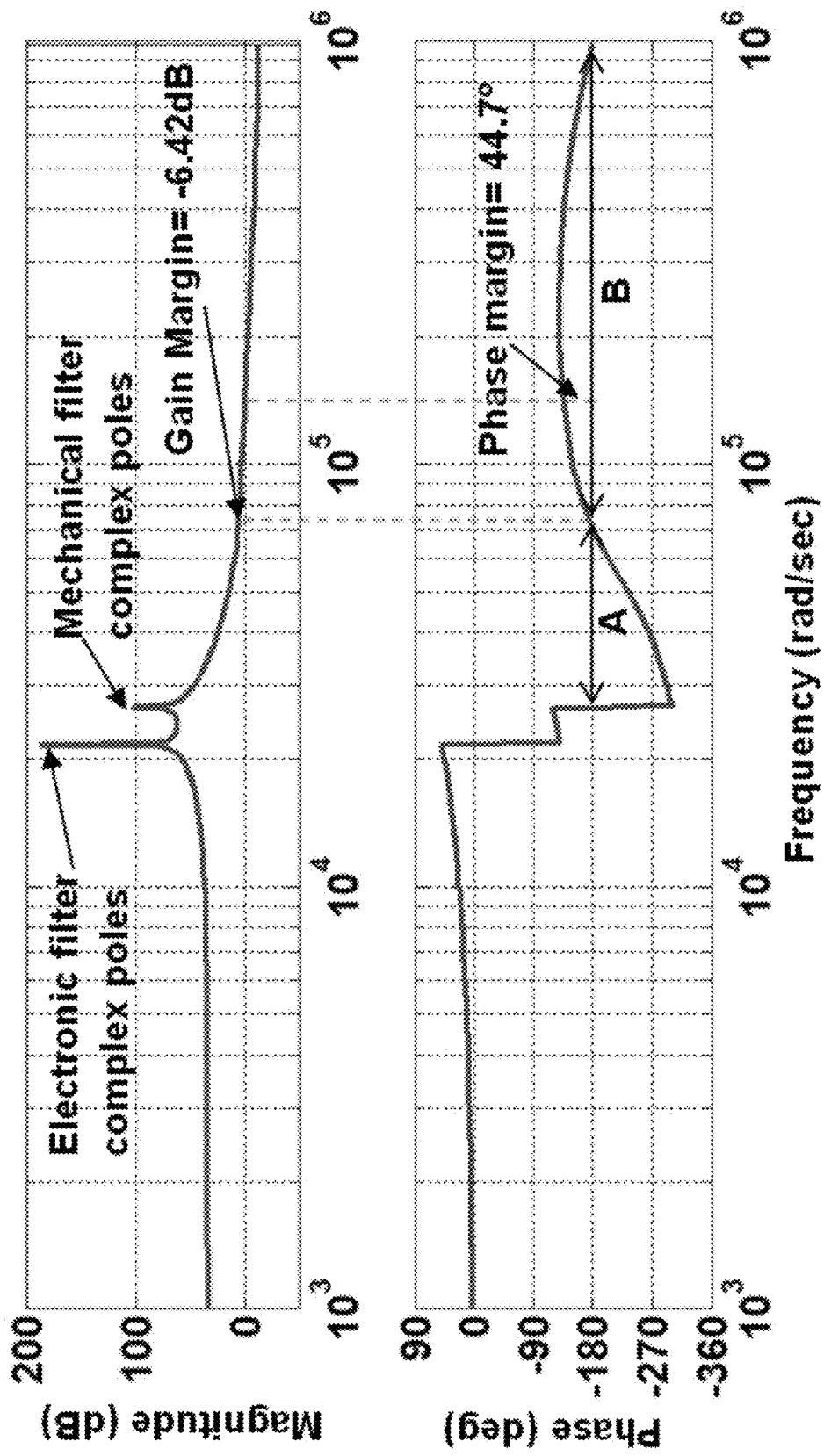
FIG. 5 is a diagram of the open loop response of the gyroscope $\Sigma$-$\Delta$ interface circuit to which FIG. 4 pertains.

Stability may be evaluated using the well-known root-locus plot. The root-locus plot of a gyroscope Σ-Δ interface circuit based on the architecture of FIG. 3 is shown in FIG. 4. The gyroscope sensor has a resonance frequency in KHz of 4.2 and a Q of 20,000. Although the example of a gyroscope has been chosen, the analysis is applicable to MEMS sensor systems generally. The root locus illustrates two pairs of complex poles, each represented by "X". One pair of the complex poles CP1 is due to the mechanical filter of the sensor, and the other pair of the complex poles CP2 is formed by the electronic filter of the Σ-Δ modulator. The root locus also illustrates four compensation zeros CZ1-4, each represented by "O". In absence of parasitic high-frequency modes, the system is stable as long as the effective quantizer gain (K) is greater than 0.4775 (−6.42 dB), which is satisfied in the gyroscope Σ-Δ interface circuit of FIG. 3. The open loop response of the same system is shown in FIG. 5, which is plotted up to a frequency of $f_s/2$, where $f_s$ is the sampling frequency of the system. The electronic filter forms a resonator (pair of complex poles) with a frequency equal to 3.47 KHz, in addition to the mechanical resonator at 4.2 KHz (note that the x-axis in FIG. 5 is in rad/sec not Hz), and the system is stable with phase margin of 44.7 degrees, for unity quantizer gain.

The 0-dB crossing point, of the open-loop magnitude response, must occur in region B of FIG. 5 of the phase response for the system to be stable. A 0-dB crossing point, at region A, results in a negative value for the phase margin, and hence cause instability. In general, a feedback system is stable if the phase shift at the 0-dB crossing points does not equal or exceed 180 degrees.

Figure 6:
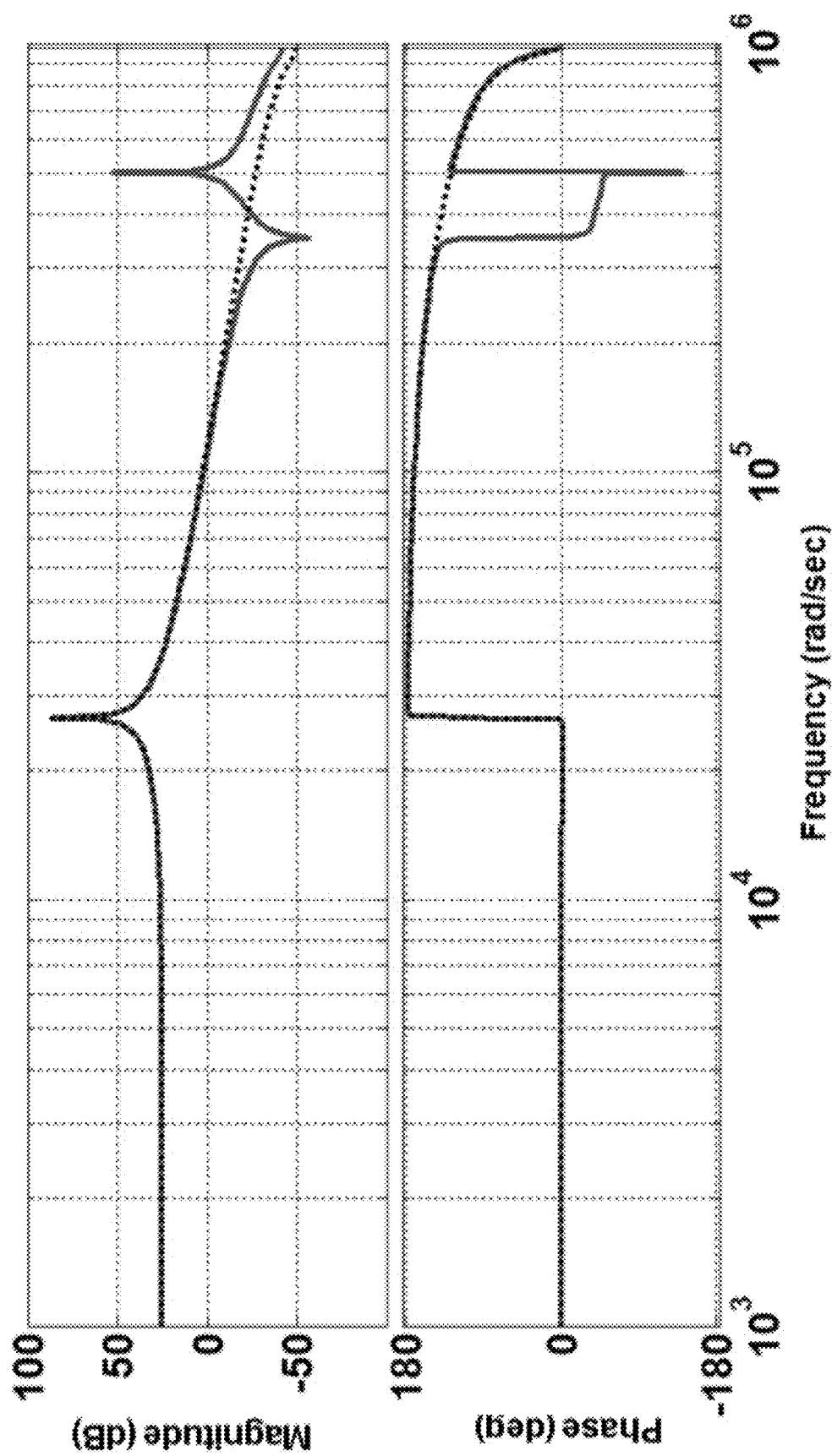
FIG. 6 is a diagram of a transfer function of a MEMS sensor having a parasitic resonance mode.
Figure 7:
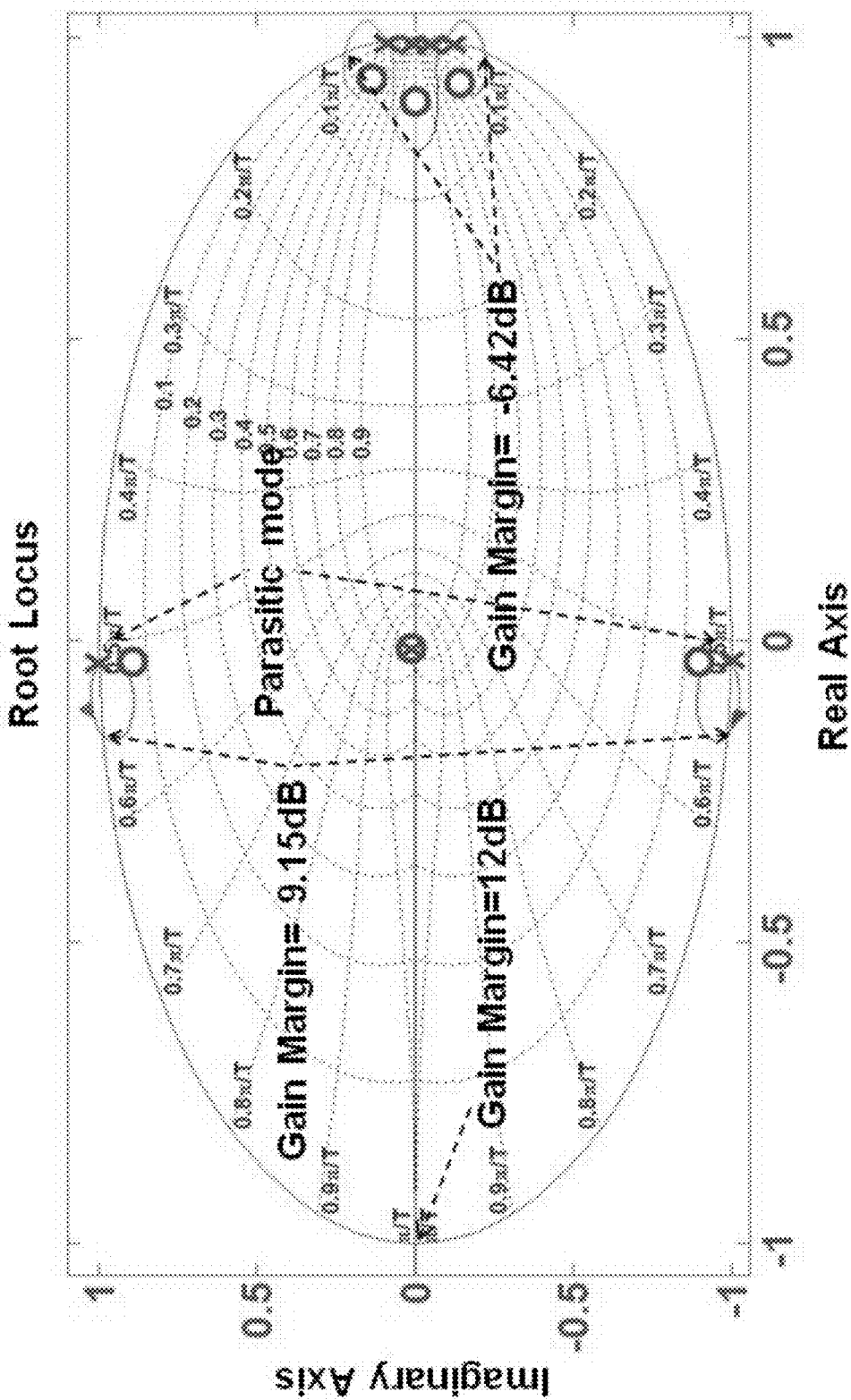
FIG. 7 is the root-locus plot of a gyroscope $\Sigma$-$\Delta$ interface system in the presence of a parasitic mode.
Figure 8:
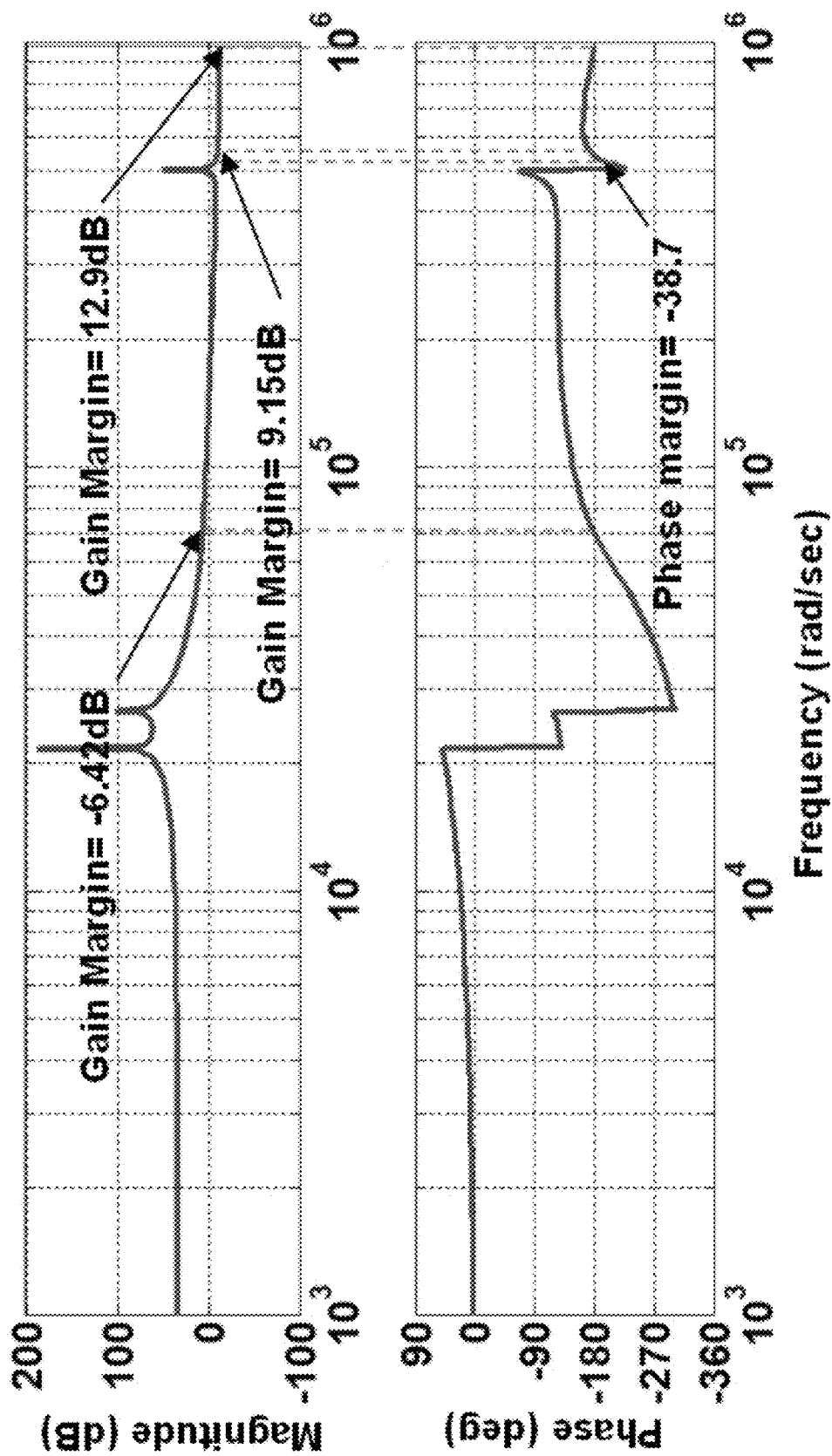
FIG. 8 is a diagram of the open loop response of the same gyroscope $\Sigma$-$\Delta$ interface system in the presence of a parasitic mode.

Without the presence of a high-Q parasitic resonance mode, the system of FIG. 3 is stable. When a high-Q parasitic resonance mode is present, however, stability is compromised. The transfer function of the MEMS, assuming a single parasitic mode, can be modeled as follows:

$$H_{mech_p} = \frac{x(s)}{F(s)} = \frac{1}{s^2 + \frac{Q}{\omega_0}s + \omega_0^2} + \frac{1}{s^2 + \frac{Q}{\omega_p}s + \omega_p^2} \quad (2)$$

where $\omega_p$ is the frequency of the parasitic mode. The resulting transfer function is shown in FIG. 6. Although practical gyroscopes may have many parasitic resonance modes, a hypothetical gyroscope with one parasitic mode is considered. In practical MEMS gyroscopes or accelerometers, the parasitic high frequency modes are clustered, with the result that the compensation solution considering a single parasitic resonance mode still stabilizes the system, as described hereafter. The root-locus plot and open loop response of a gyroscope Σ-Δ interface system, in the presence of a parasitic mode at 80-KHz, are shown in FIG. 7 and FIG. 8, respectively. As seen in FIG. 8, the resulting system is unstable, since the parasitic mode introduces additional 0-dB crossing points, where at one of them the phase margin is of a negative value. If the loop gain is reduced to bring the peak of the parasitic mode below 0 dB, a negative phase margin 0-dB point arises at another frequency. If the parasitic mode is of low Q instead of high Q, then it may not cause the magnitude response to cross the 0-dB, and hence may not cause instability.

Figure 9:
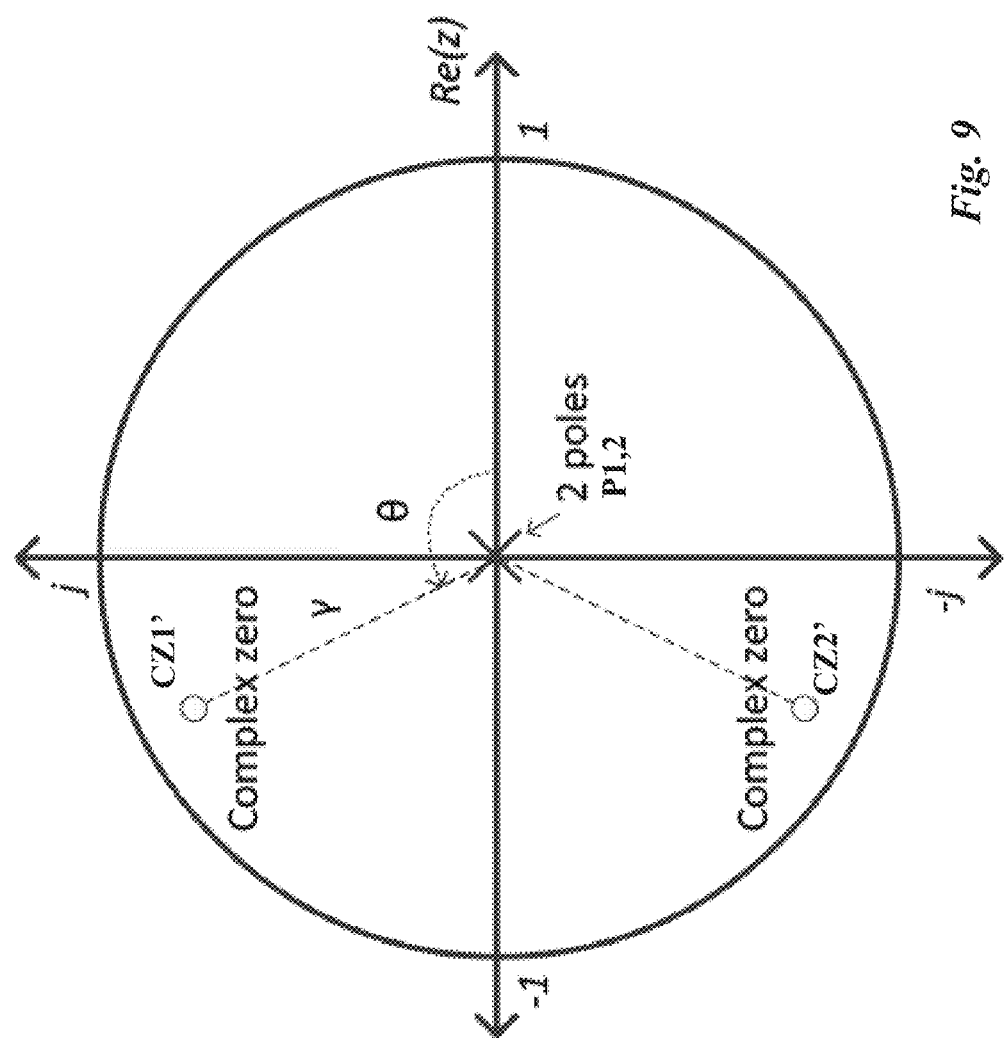
FIG. 9 is diagram of complex poles and zeros in the Z-domain complex plane, representing a compensation filter.

In general, introducing additional filtering to a Σ-Δ loop, with parasitic modes, to cancel or attenuate the parasitic resonance modes, increases system order and degrades the stability of the already unstable system, unless a particular arrangement of additional poles and zeros are introduced in a way considers the system original poles and zeros, and allows restoring system stability. In particular, as illustrated in FIG. 9, a pair of complex zeros CZ1' and CZ2' is introduced with magnitude y that is adjusted according to parasitic mode quality factor and an angle θ that depends on the parasitic mode frequency. However, complex zeros are not physically realizable in a discrete-time system. Therefore, an additional two poles P1,2 must be added. To avoid having these poles alter the response resulting of the complex zero, these two poles are added at the origin of the z-domain (z=0), as shown in FIG. 9. The introduced poles and zeros are represented by:

$$H_{FIR} = \frac{(z-\gamma^{j\theta})(z-\gamma^{-j\theta})}{z^2} = \frac{(z\,\gamma^{j\omega_p/f_s})(z\,\gamma^{-j\omega_p/f_s})}{z^2} = 1 + \alpha z^{-1} + \beta z^{-2} \quad (3)$$

The resulting transfer function of the introduced poles and zeros is of an FIR nature. Note that using standard analog filters, such as Butterworth, Chebyshev, elliptic or Bessel, or their digital realization that has an infinite-impulse-response (IIR) nature, introduces poles to the system that degrades the stability, as mentioned earlier.

Figure 10:
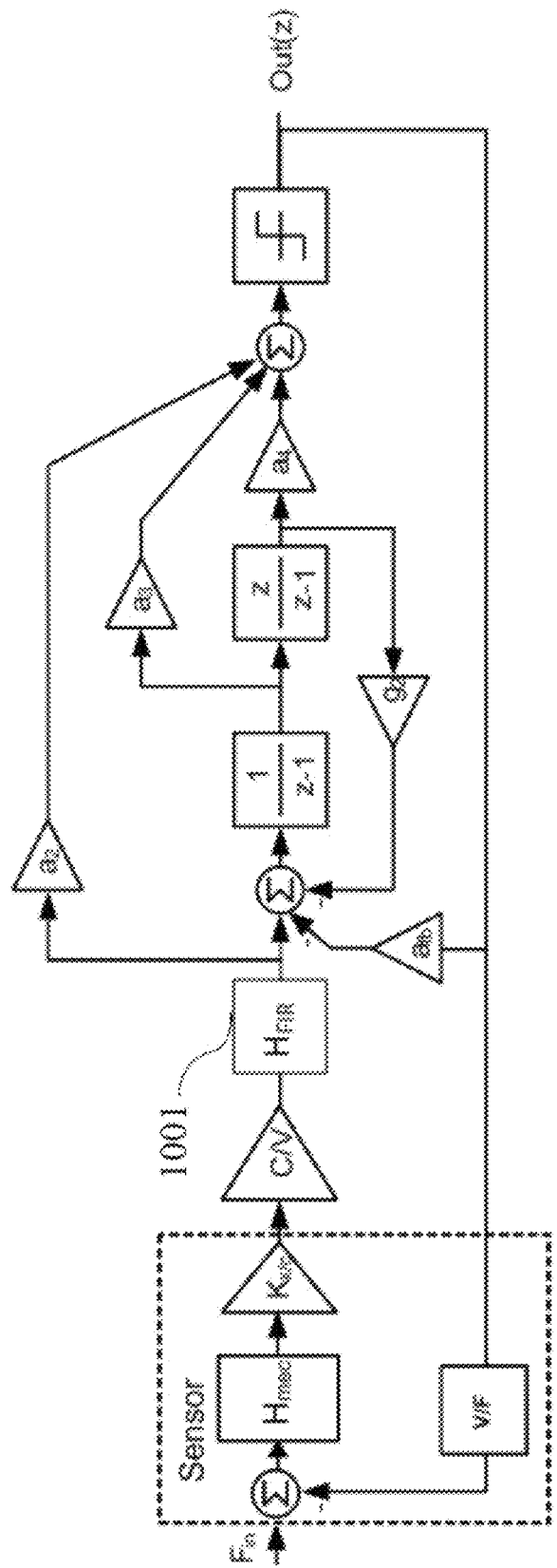
FIG. 10 is a block diagram of a compensated electro-mechanical $\Sigma$-$\Delta$ loop system.
Figure 11:
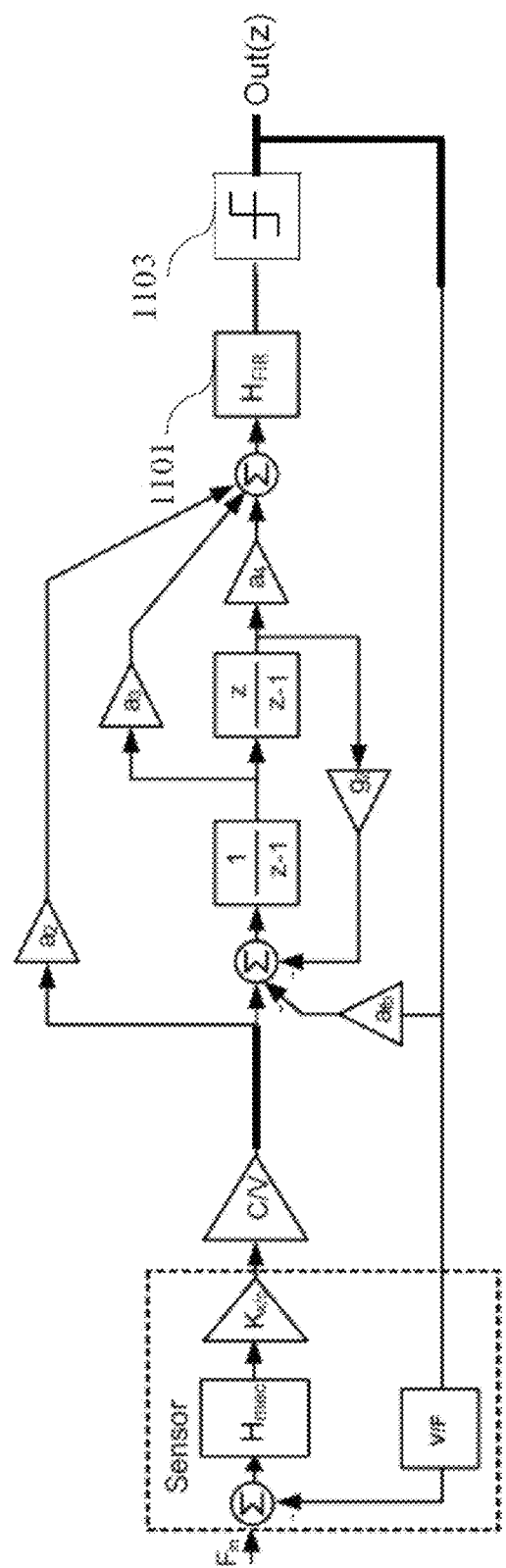
FIG. 11 is a block diagram of another compensated electro-mechanical $\Sigma$-$\Delta$ loop system.

Referring to FIG. 10, a compensated electro-mechanical Σ-Δ loop system is shown that includes a custom FIR filter 1001 having the foregoing characteristics. Another embodiment is shown in FIG. 11, in which a custom FIR filter 1101 is placed directly preceding the loop comparator 1103. In this case, the filter 1101, besides working as a compensator, also provides feedback shaping.

Figure 12:
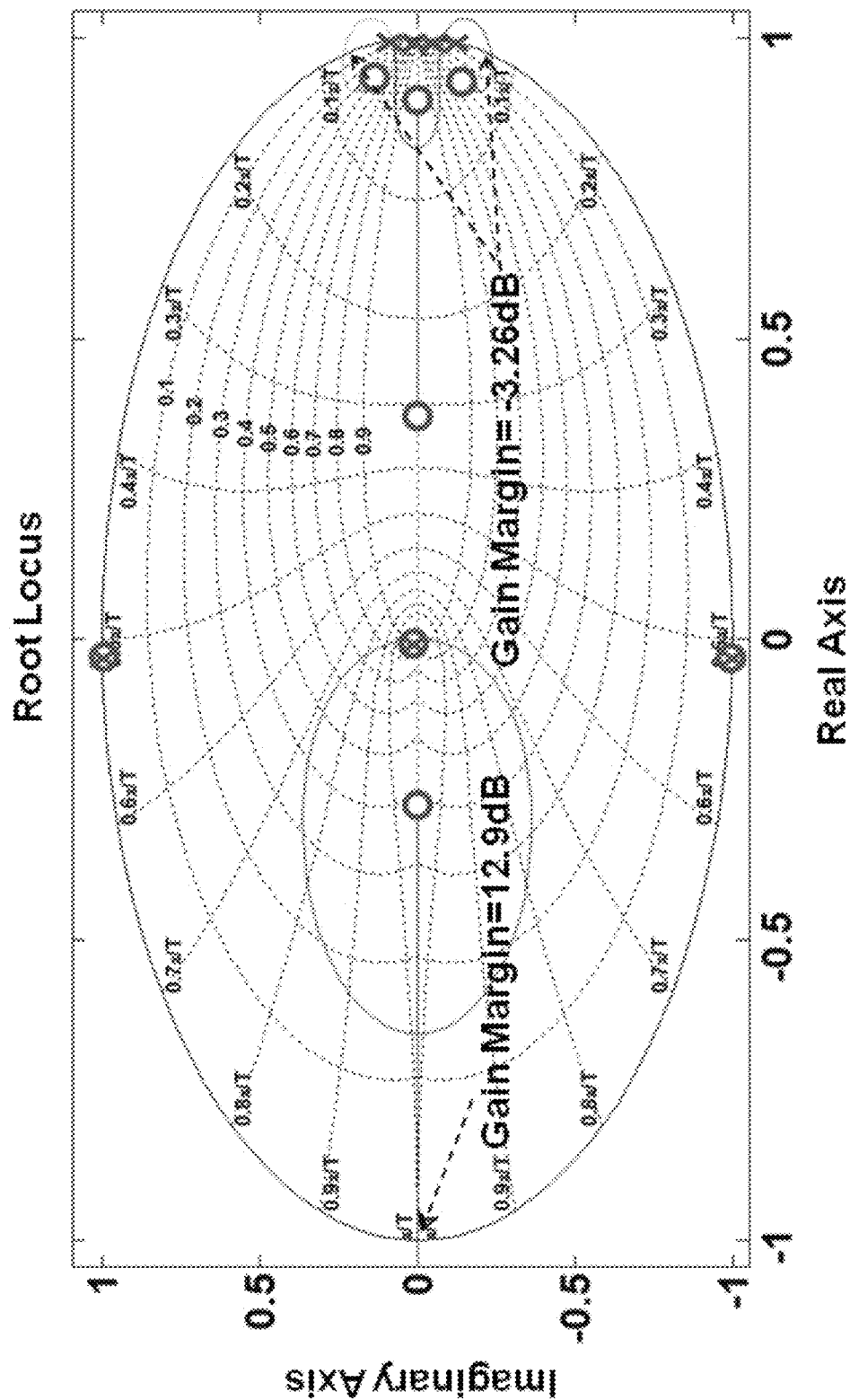
FIG. 12 is root-locus plot of the compensated electro-mechanical $\Sigma$-$\Delta$ interface loop system of FIG. 10.
Figure 13:
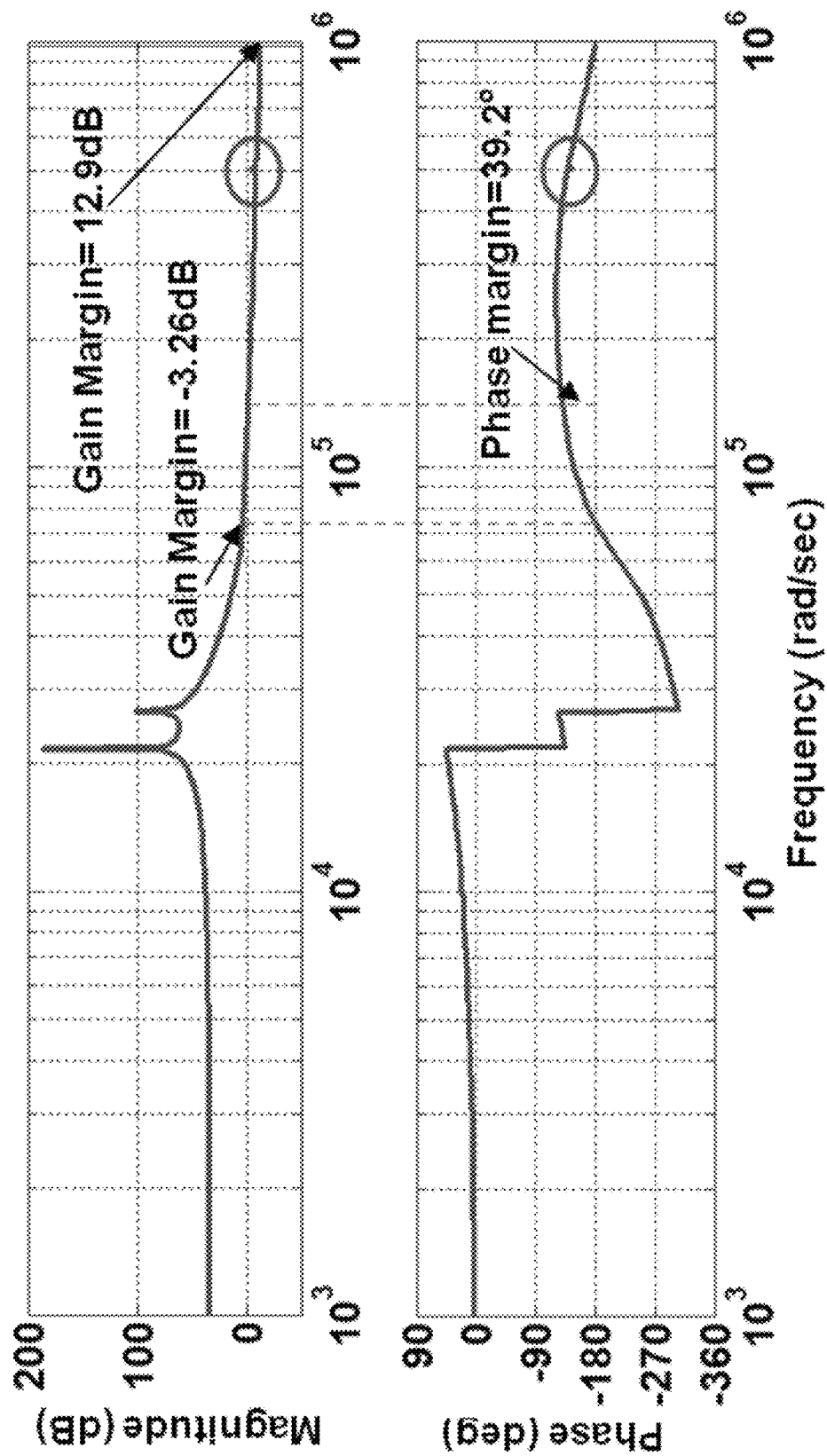
FIG. 13 is a diagram of the open loop response of the electro-mechanical $\Sigma$-$\Delta$ loop system of FIG. 10.

The root-locus plot and open loop response of a gyroscope Σ-Δ interface system stabilized using a filter built with complex zeros and poles at the origin of the z-domain as described are shown in FIG. 12 and FIG. 13, respectively. As seen in FIG. 13, the compensated system is stable and has a gain margin of −3.26 dB, compared to −6.42 dB in the case where no parasitic modes are present. The circles in FIG. 13 highlight the location of the parasitic mode, before compensation.

Figure 14:
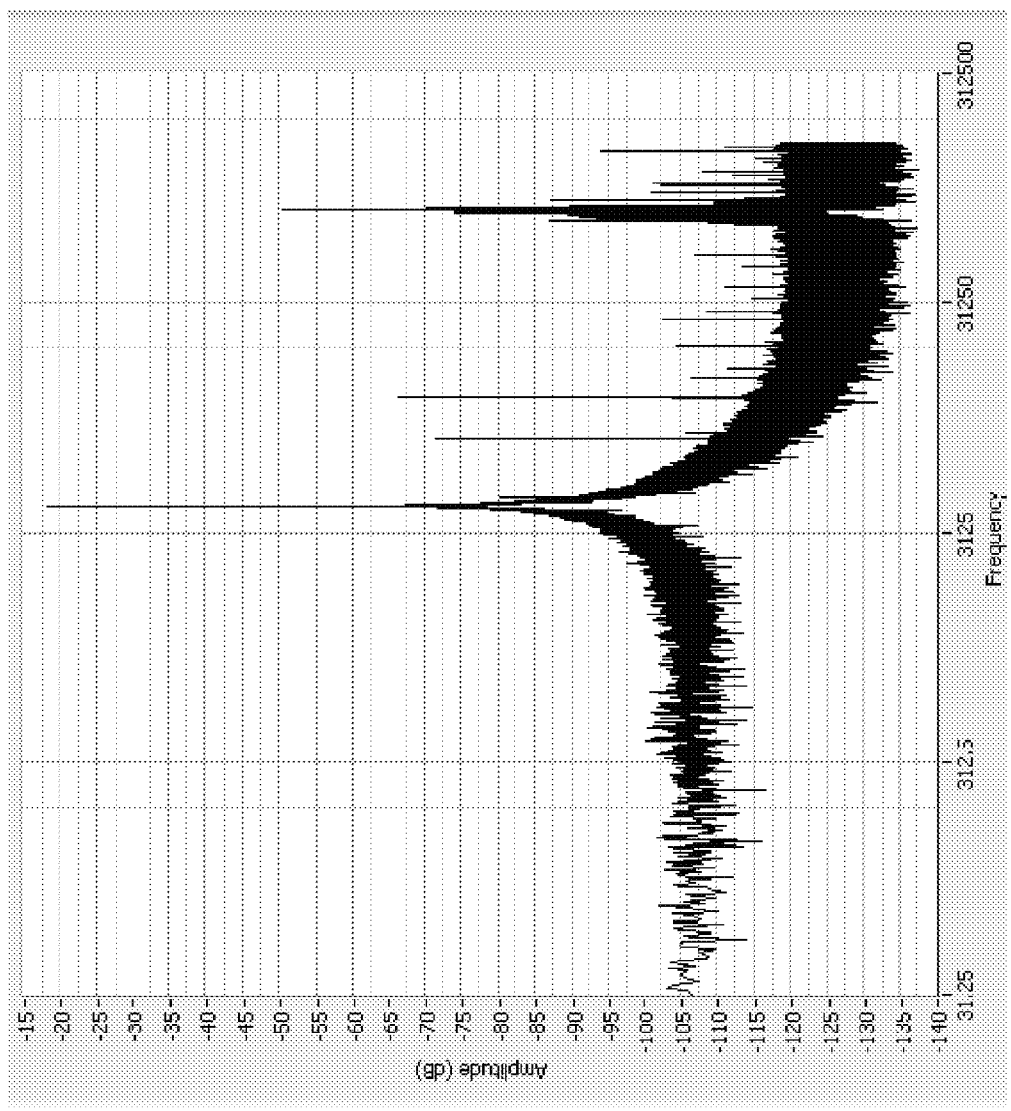
FIG. 14 is a diagram of the frequency response of a MEMS gyro.
Figure 15:
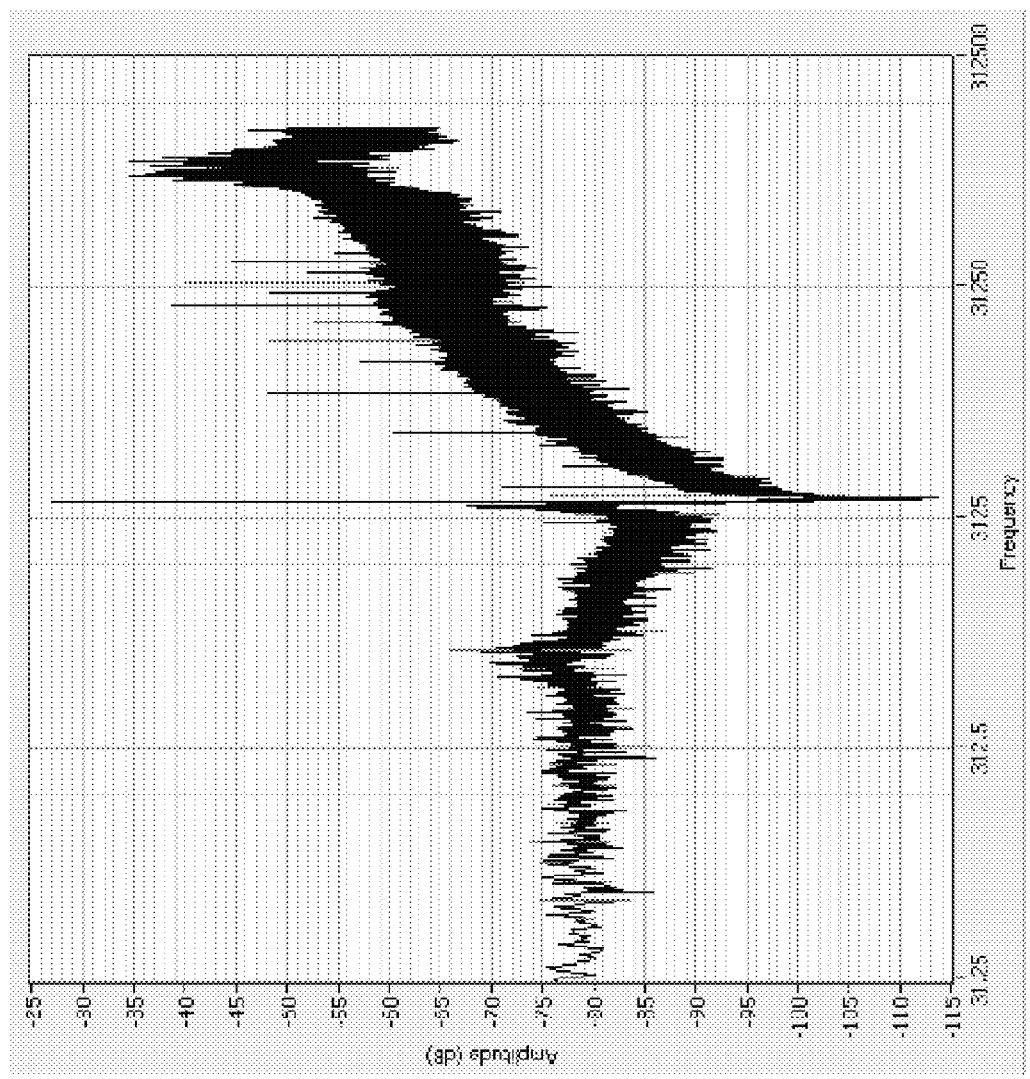
FIG. 15 is a diagram of the measured Σ-Δ loop output of a system using the MEMS gyro of FIG. 14, with a custom filter active.

A gyroscope test platform was constructed to demonstrate stabilization of an electronic-mechanical Σ-Δ modulator in the presence of parasitic high-Q modes. The test platform was composed mainly of a C/V, interfacing with the MEMS sensor, followed by an A/D converter, a field-programmable-gate-array (FPGA), and an actuation digital-to-analog converter. The FPGA implemented the Σ-Δ loop filter and the FIR block. The A/D-FPGA arrangement provided the needed flexibility for testing stability. The frequency response of the MEMS gyro used with the test platform is shown in FIG. 14 and was determined by applying a pseudo-random actuation sequence to the MEMS sensor and measuring the MEMS capacitance signal at its detection electrodes. The MEMS sensor had a main resonance mode close to 4-KHz and a cluster of many parasitic high-Q modes around 80-KHz. The measured Σ-Δ loop output with the custom FIR filter active is shown in FIG. 15, showing stable operation and proper Σ-Δ noise-shaping, in the presence of a bunch of parasitic modes clustered at 80-KHz. Measurements showed that the stability achieved is robust against MEMS process and temperature variations. The test platform achieved a +/−100 degrees/s input signal range and a noise floor of 1 m degrees/s/√Hz.

Practical MEMS sensors have parasitic modes that can lead to instability of Σ-Δ based feedback force feedback systems. As has been described, such systems can be stabilized by, in one embodiment, insertion of a pair of complex zeros and two poles located at the Z-domain origin. Stability analysis (root locus plots and stability margins of open loop response) indicates stable operation. This stabilization approach is much simpler than the prior approach of Ezekwe. In addition, the proposed solution is not limited to second order and low-Q parasitic modes, as the case of the design recommendations of Seeger. A test platform was used to demonstrate stable operation in the presence of high-Q modes. The test platform shows that the solution stabilizes the ΣΔ electromechanical loop, in the presence of a number of parasitic modes clustered around a certain frequency.

What is claimed is:

1. A method of electronically interfacing with a MEMS sensor using an interface circuit, the MEMS sensor and the interface circuit together forming a sigma-delta modulator loop, the method comprising:
    identifying a potential parasitic resonant mode of the sigma-delta modulator loop, the potential parasitic resonant mode having a frequency and a quality factor;
    inserting into the sigma-delta modulator loop a filter having characteristics chosen in accordance with at least one of the frequency and the quality factor of the potential parasitic resonant mode.

2. The method of claim 1, wherein the filter is an FIR filter.

3. The method of claim 2, wherein the FIR filter is configured so as to be represented in the complex plane by a pair of complex zeros and a pair of poles located at the origin.

4. The method of claim 1, wherein the filter has characteristics chosen in accordance with both the frequency and the quality factor of the potential parasitic resonant mode.

5. The method of claim 1, further comprising increasing stability of the sigma-delta modulator loop by providing a feedback branch between a feed forward loop portion of the sigma-delta modulator loop and a feedback portion of the sigma-delta modulator loop.

6. The method of claim 1, wherein the sigma-delta modulator is a fourth-order sigma-delta modulator.

7. An interface circuit for electronically interfacing with a MEMS sensor using an interface circuit, the MEMS sensor and the interface circuit together forming a sigma-delta modulator loop having a potential parasitic resonant mode characterized by a frequency and a quality factor, the interface circuit comprising:
  a capacitance to voltage converter;
  a forward loop circuit coupled to the capacitance to voltage converter and comprising a quantizer;
  a feedback loop coupled to the quantizer and providing a force feedback signal to the MEMS sensor; and
  a filter inserted into the forward loop circuit and having characteristics chosen in accordance with at least one of the frequency and the quality factor of the parasitic resonant mode.

8. The apparatus of claim 7, wherein the filter is an FIR filter.

9. The method of claim 8, wherein the FIR filter is configured so as to be represented in the complex plane by a pair of complex zeros and a pair of poles located at the origin.

10. The apparatus of claim 7, wherein the filter has characteristics chosen in accordance with both the frequency and the quality factor of the potential parasitic resonant mode.

11. The apparatus of claim 7, further comprising a stabilization circuit providing a path from the feedback loop to the feedforward circuit without passing through the MEMS sensor.

12. The apparatus of claim 7, wherein the sigma-delta modulator is a fourth-order sigma-delta modulator.

13. A sensor subsystem comprising:
  MEMS sensor;
  an interface circuit coupled to the MEMS sensor, the MEMS sensor and the interface circuit together forming a sigma-delta modulator loop having a potential parasitic resonant mode characterized by a frequency and a quality factor, the interface circuit comprising:
    a capacitance to voltage converter;
    a forward loop circuit coupled to the capacitance to voltage converter and comprising a quantizer;
    a feedback loop coupled to the quantizer and providing a force feedback signal to the MEMS sensor; and
    a filter inserted into the forward loop circuit and having characteristics chosen in accordance with at least one of the frequency and the quality factor of the parasitic resonant mode.

14. The apparatus of claim 13, wherein the filter is an FIR filter.

15. The method of claim 14, wherein the FIR filter is configured so as to be represented in the complex plane by a pair of complex zeros and a pair of poles located at the origin.

16. The apparatus of claim 13, wherein the filter has characteristics chosen in accordance with both the frequency and the quality factor of the potential parasitic resonant mode.

17. The apparatus of claim 13, further comprising a stabilization circuit providing a path from the feedback loop to the feedforward circuit without passing through the MEMS sensor.

18. The apparatus of claim 13, wherein the sigma-delta modulator is a fourth-order sigma-delta modulator.

* * * * *